(12) United States Patent
Rhie et al.

(10) Patent No.: US 10,809,319 B2
(45) Date of Patent: Oct. 20, 2020

(54) DEVICE AND METHOD FOR MEASURING MAGNETIC FIELD USING SPIN HALL EFFECT

(71) Applicant: Korea University Research and Business Foundation, Sejong Campus, Sejong-si (KR)

(72) Inventors: Kung-Won Rhie, Sejong (KR); Dong-Seok Kim, Sejong (KR); Sung-Jung Joo, Daejeon (KR)

(73) Assignee: KOREA UNIVERSITY RESEARCH AND BUSINESS FOUNDATION, SEJONG CAMPUS, Sejong-si (KR)

( * ) Notice: Subject to any disclaimer, the term of this patent is extended or adjusted under 35 U.S.C. 154(b) by 161 days.

(21) Appl. No.: 16/075,244

(22) PCT Filed: Feb. 3, 2017

(86) PCT No.: PCT/KR2017/001173
§ 371 (c)(1),
(2) Date: Nov. 7, 2018

(87) PCT Pub. No.: WO2017/135720
PCT Pub. Date: Aug. 10, 2017

(65) Prior Publication Data
US 2019/0079147 A1   Mar. 14, 2019

(30) Foreign Application Priority Data

Feb. 3, 2016  (KR) .................. 10-2016-0013479

(51) Int. Cl.
*G01R 33/06*   (2006.01)
*G01R 33/07*   (2006.01)
(Continued)

(52) U.S. Cl.
CPC ......... *G01R 33/075* (2013.01); *G01R 15/202* (2013.01); *G01R 33/06* (2013.01);
(Continued)

(58) Field of Classification Search
CPC .... G01R 33/07; G01R 33/077; G01R 15/202; G01R 33/072; G01R 33/075; G01R 33/09; G01R 15/207; G01R 19/0092
See application file for complete search history.

(56) References Cited

U.S. PATENT DOCUMENTS

2002/0067581 A1* 6/2002 Hiramoto ............. G01R 33/098
360/322
2003/0094944 A1* 5/2003 Suzuki ................. G01R 33/093
324/252
(Continued)

FOREIGN PATENT DOCUMENTS

JP    2006-208295 A    8/2006
JP    2015-527565 A    9/2015
(Continued)

OTHER PUBLICATIONS

Japanese Office Action dated Jul. 30, 2019 in connection with counterpart Japanese Patent Application No. 2018-541223, citing the above references.
(Continued)

*Primary Examiner* — Raul J Rios Russo
(74) *Attorney, Agent, or Firm* — Hauptman Ham, LLP

(57) ABSTRACT

The present invention relates to a device and a method for measuring a magnetic field, wherein a spin current is injected into a magnetic body that has magnetic anisotropy using a spin Hall effect occurring in a current applied to a conductor, and the degree of shift of hysteresis in the magnetic body is calculated while reversing the magnetization of the magnetic body by a spin torque such that an
(Continued)

external magnetic field applied to the magnetic body can be measured precisely.

20 Claims, 18 Drawing Sheets

(51) Int. Cl.
  *G01R 33/14* (2006.01)
  *G01R 33/12* (2006.01)
  *G01R 15/20* (2006.01)
  *G01R 33/09* (2006.01)
  *G01R 19/00* (2006.01)

(52) U.S. Cl.
  CPC .......... *G01R 33/07* (2013.01); *G01R 33/072* (2013.01); *G01R 33/077* (2013.01); *G01R 33/09* (2013.01); *G01R 33/12* (2013.01); *G01R 33/14* (2013.01); *G01R 15/207* (2013.01); *G01R 19/0092* (2013.01)

(56) References Cited

U.S. PATENT DOCUMENTS

| | | | | |
|---|---|---|---|---|
| 2006/0002031 A1* | 1/2006 | Shoji | ............ | G11B 5/127 360/313 |
| 2007/0257565 A1* | 11/2007 | Urey | ............ | H02K 33/08 310/38 |
| 2007/0264727 A1 | 11/2007 | Engel et al. | | |
| 2014/0177327 A1 | 6/2014 | Khalili Amiri et al. | | |
| 2015/0129995 A1 | 5/2015 | Wang et al. | | |
| 2015/0168502 A1* | 6/2015 | Furuya | ............ | G01R 33/0064 703/2 |
| 2016/0266172 A1* | 9/2016 | Ostrick | ............ | G01R 15/207 |

FOREIGN PATENT DOCUMENTS

| | | |
|---|---|---|
| KR | 10-0820079 B1 | 4/2008 |
| KR | 10-2012-0091804 A | 8/2012 |
| KR | 10-2014-0134271 A | 11/2014 |

OTHER PUBLICATIONS

International Search Report dated May 17, 2017, issued in corresponding International Patent Application No. PCT/KR2017/001173, citing the above references.

Masamitsu Hayashi et al., "Quantitative characterization of the spin-orbit torque using harmonic Hall voltage measurements," Physical Review B, Apr. 1, 2014, vol. 89, No. 14, American Physical Society.

Extended European Search Report dated Sep. 3, 2019, in connection with counterpart European Patent Application No. 17747765, citing the above references.

* cited by examiner

DEVICE AND METHOD FOR MEASURING MAGNETIC FIELD USING SPIN HALL EFFECT

CROSS REFERENCE TO RELATED APPLICATION

This present application is a national stage filing under 35 U.S.C § 371 of PCT application number PCT/KR2017/001173 filed on Feb. 3, 2017 which is based upon and claims the benefit of priority to Korean Patent Application No. 10-2016-0013479 filed on Feb. 3, 2016, in the Korean Intellectual Property Office. The disclosures of the above-listed applications are hereby incorporated by reference herein in their entirety.

TECHNICAL FIELD

The present invention relates to a device and method for measuring a magnetic field and, more particularly, to a device and method for measuring a magnetic field, wherein a spin current is injected into a magnetic body having magnetic anisotropy using a spin hall effect in a current applied to a conductor, the magnetization of the magnetic body is reversed by a spin torque, the magnetic hysteresis curve of the magnetic body is derived, and an external magnetic field applied to the magnetic body can be precisely calculated by taking into consideration a shift degree of the magnetic hysteresis curve.

BACKGROUND ART

A magnetic sensor refers to a device for measuring the size or direction of a magnetic field based on a change in the magnetization degree or magnetic resistance of a substance depending on an externally applied magnetic field. The magnetic sensor has been conventionally used in various fields, such as vehicles, aerospace and national defense. The demand for the magnetic sensor is rapidly increased as the supply of portable personal terminals, such as smartphones, is recently increased rapidly.

Magnetic sensors that are used a lot may include a hall magnetic sensor using a hall phenomenon, a giant magneto-resistance (GMR) sensor using a GMR phenomenon, a tunneling magneto-resistance (TMR) sensor, and a fluxgate magnetic sensor. More specifically, the GMR sensor measures an external magnetic field using a phenomenon in which in a magnetic multi-layer thin-film structure having a magnetic layer/non-magnetic layer/magnetic layer, a lot of current flows due to low electric resistance when the magnetization directions of the two magnetic layers are a parallel state due to an external magnetic field and a low current flows due to high electric resistance when the magnetization directions of the two magnetic layers are an anti-parallel state. Furthermore, the fluxgate magnetic sensor measures an external magnetic field by measuring the waveform of high harmonics in a secondary coil when the external magnetic field is applied in addition to a waveform in the secondary coil, which is induced by a primary coil, using the primary coil and secondary coil wound on a core having high permeability.

Such magnetic sensors may have various characteristics, such as sensitivity, a noise floor and a size, depending on the type thereof. A suitable magnetic sensor is selected and used depending on various applications. For example, the GMR sensor and the TMR sensor are chiefly used for information reading in a hard disk drive (HDD) because they can measure a magnetic field of a 100 gauss level and can be fabricated in a micro scale. Furthermore, the fluxgate magnetic sensor is widely used for a terrestrial magnetic sensor or an electronic compass because it can measure a magnetic field of a 10 gauss level with high sensitivity. However, the size and noise characteristics of the magnetic sensors conflict with each other. Accordingly, the magnetic sensors may have problems in that it is difficult for the magnetic sensors to implement magnetic sensors having a small size and an excellent noise characteristic and a production cost rises depending on their structural characteristics.

Furthermore, a hall sensor implemented based on a silicon (Si) process by taking into consideration a production cost and a size is recently used a lot. However, the hall sensor implemented based on the silicon (Si) process may have a problem in that sensitivity is greatly reduced, such as that resolution falls short of terrestrial magnetism dip resolution. In order to overcome this problem, the sensitivity of the sensor is improved using a method of focusing a terrestrial magnetic field by stacking integrated magnetic concentrators (IMCs). In such a case, however, there are still problems in that the IMC layer must be thickly formed 0.1~0.3 micrometers, a noise floor is high and resolution is low.

DISCLOSURE

Technical Problem

The present invention has been made to solve the aforementioned conventional problems, and an object of the present invention is to provide a device and method for measuring a magnetic field, which can be reduced in size, can improve sensitivity and a noise characteristic, and can be fabricated at a low product cost.

Technical Solution

A device for measuring a magnetic field according to an embodiment of the present invention for accomplishing the object is a magnetic field measurement device measuring an externally applied first magnetic field, including current application means for applying a current to a conductor; a conductor in which a spin current is formed by a current applied from the current application means; a magnetic body which has magnetic anisotropy and into which the spin current formed in the conductor is injected; magnetic field application means for applying a second magnetic field to the magnetic body; and a controller deriving a shift degree of a magnetic hysteresis curve of the magnetic body when the first magnetic field is applied with respect to a magnetic hysteresis curve of the magnetic body in the state in which the first magnetic field has not been applied and then calculating intensity of the first magnetic field using the derived shift degree.

In this case, the controller may calculate the magnetic hysteresis curve of the magnetic body while increasing or decreasing the amount of the spin current by changing the amount of the current applied from the current application means to the conductor and may then calculate the shift degree of the magnetic hysteresis curve of the magnetic body when the first magnetic field is applied.

In this case, the controller may calculate the magnetic hysteresis curve of the magnetic body by measuring a hall voltage in the conductor or the magnetic body while changing the amount of the current applied from the current application means to the conductor.

In this case, the current applied from the current application means to the conductor may increase up to a point of time at which a magnetization of the magnetic body is reversed or later and may then decrease up to a point of time at which the magnetization of the magnetic body is reversed again or later or may decrease up to a point of time at which the magnetization of the magnetic body is reversed or later and may then increase up to a point of time at which the magnetization of the magnetic body is reversed again or later.

Furthermore, the magnetic body may have vertical magnetic anisotropy, and the calculated intensity of the first magnetic field may be vertical intensity of the first magnetic field applied to the magnetic body.

Furthermore, the conductor may be transition metal or heavy metal.

Furthermore, the thickness of the conductor may be determined by taking into consideration a spin diffusion length.

Furthermore, the conductor and the magnetic body may form a stack structure.

Furthermore, the magnetic field application means may include a horizontal magnetic anisotropy magnetic body positioned on the top or bottom of the magnetic body.

Furthermore, the controller may use a previously measured and stored magnetic hysteresis curve or a magnetic hysteresis curve in the state in which absolute values of a first current at a point of time at which the magnetization of the magnetic body is reversed and a second current at a point of time at which the magnetization of the magnetic body is reversed again in an opposite direction are identical as the magnetic hysteresis curve of the magnetic body when the first magnetic field is not applied.

Furthermore, the controller may calculate the intensity of the first magnetic field from the derived shift degree of the magnetic hysteresis curve of the magnetic body using a shift value of the magnetic hysteresis curve based on previously stored intensity of the first magnetic field.

A method of measuring a magnetic field according to another aspect of the present invention is a magnetic field measurement method of measuring an externally applied first magnetic field, including a current application step of applying a current to a conductor; a magnetic field application step of applying a second magnetic field to a magnetic body having magnetic anisotropy; a spin current injection step of injecting a spin current formed by a current received by the conductor into the magnetic body; a magnetic hysteresis curve shift derivation step of deriving a shift degree of a magnetic hysteresis curve of the magnetic body when the first magnetic field is applied with respect to a magnetic hysteresis curve of the magnetic body in the state in which the first magnetic field may have not been applied; and a first magnetic field calculation step of calculating intensity of the first magnetic field using the derived shift degree of the magnetic hysteresis curve of the magnetic body.

In this case, in the current application step, the amount of the spin current may be increased or decreased by changing the amount of the current applied to the conductor. In the first magnetic field calculation step, after the magnetic hysteresis curve of the magnetic body is calculated based on the increase or decrease of the spin current, the shift degree of the magnetic hysteresis curve of the magnetic body when the first magnetic field is applied may be calculated.

In this case, the first magnetic field calculation step may include the step of calculating the magnetic hysteresis curve of the magnetic body by measuring a hall voltage in the conductor or the magnetic body according to a change in the amount of the current applied to the conductor.

In this case, in the spin current injection step, the current applied to the conductor may increase up to a point of time at which the magnetization of the magnetic body is reversed or later and may then decrease up to a point of time at which the magnetization of the magnetic body is reversed again or later or may decrease up to a point of time at which the magnetization of the magnetic body is reversed or later and may then increase up to a point of time at which the magnetization of the magnetic body is reversed again or later.

Furthermore, the magnetic body may have vertical magnetic anisotropy, and the calculated intensity of the first magnetic field may be vertical intensity of the first magnetic field applied to the magnetic body.

Furthermore, the conductor may be transition metal or heavy metal.

Furthermore, the thickness of the conductor may be determined by taking into consideration a spin diffusion length.

Furthermore, the conductor and the magnetic body may form a stack structure.

Furthermore, in the magnetic field application step, a second magnetic field may be applied to the magnetic body using a horizontal magnetic anisotropy magnetic body positioned on the top or bottom of the magnetic body.

Furthermore, in the magnetic hysteresis curve shift derivation step, a previously measured and stored magnetic hysteresis curve or a magnetic hysteresis curve in the state in which absolute values of a first current at a point of time at which the magnetization of the magnetic body is reversed and a second current at a point of time at which the magnetization of the magnetic body is reversed again in an opposite direction are identical is used as the magnetic hysteresis curve of the magnetic body when the first magnetic field is not applied.

Furthermore, in the first magnetic field calculation step, the intensity of the first magnetic field may be calculated from the derived shift degree of the magnetic hysteresis curve of the magnetic body using a shift value of the magnetic hysteresis curve based on previously stored intensity of the first magnetic field.

Advantageous Effects

According to the present invention, there can be provided the device and method for measuring a magnetic field, wherein a spin current is injected into the magnetic body having magnetic anisotropy using a spin hall effect in a current applied to the conductor, the magnetization of the magnetic body is reversed by a spin torque, the magnetic hysteresis curve of the magnetic body is derived, and an external magnetic field applied to the magnetic body can be precisely calculated by taking into consideration a shift degree of the magnetic hysteresis curve.

DESCRIPTION OF DRAWINGS

The accompanying drawings included as part of the detailed description in order to help understanding of the present invention provide embodiments of the present invention, and describe the technical spirit of the present invention along with the detailed description.

BEST MODE FOR INVENTION

The present invention may be modified in various ways and may have various embodiments. Hereinafter, specific embodiments are described in detail based on the accompanying drawings.

In describing the present invention, a detailed description of related known technologies will be omitted if it is deemed to make the gist unnecessarily vague.

Terms, such as the first and the second, may be used to describe various elements, but the elements should not be restricted by the terms. The terms are used to only distinguish one element from the other element.

Hereinafter, embodiments of a device and method for measuring a magnetic field according to the present invention are described in detail with reference to the accompanying drawings.

Figure 1:
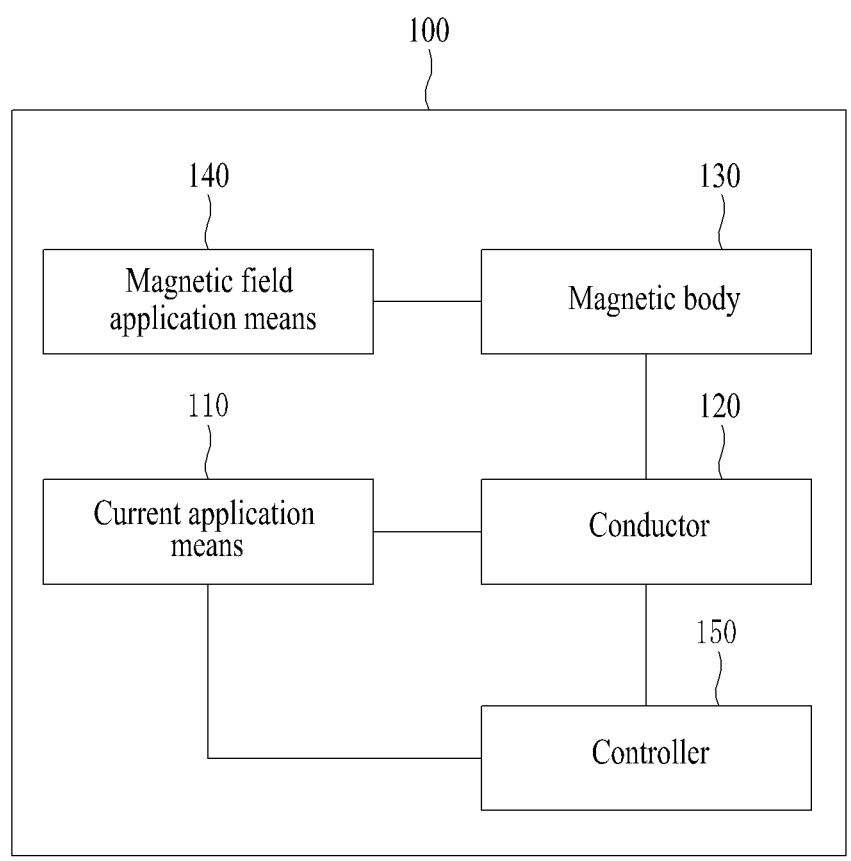
FIG. 1 shows the configuration of a device for measuring a magnetic field according to an embodiment of the present invention.

First, FIG. 1 shows the configuration of a device 100 for measuring a magnetic field according to an embodiment of the present invention. As may be seen from FIG. 1, the device 100 for measuring a magnetic field according to an embodiment of the present invention may include current application means 110, a conductor 120, a magnetic body 130, magnetic field application means 140 and a controller 150. The device 100 for measuring a magnetic field according to an embodiment of the present invention is divided for each element and described in detail.

First, the current application means 110 applies a given current to the conductor 120. The current application means 110 may deliver an externally supplied current to the conductor 120 or may include a circuit for generating a given current using power. The current application means 110 may be adopted as an embodiment of the present invention without a special restriction if it can provide a suitable current to the conductor 120.

Furthermore, a current applied from the current application means 110 to the conductor 120 may be controlled by the controller 150. The controller 150 may properly control a spin current formed in the conductor 120 by controlling the amount, waveform, etc. of a current applied from the current application means 110 to the conductor 120.

Next, the conductor 120 receives a current from the current application means 110 and forms a spin current. The conductor 120 may be adopted without a special restriction if it can form a spin current using a spin hall phenomenon. Furthermore, if transition metal or heavy metal is used as the conductor 120, there may be an advantage in which the characteristics of the device 100 for measuring a magnetic field according to an embodiment of the present invention can be further improved because a spin hall effect can appear more effectively as the spin orbit interaction is increased. Furthermore, the thickness of the conductor 120 may be various depending on a substance that forms the conductor 120, but is determined by taking a spin diffusion length into consideration. Accordingly, the characteristics of the device 100 for measuring a magnetic field according to an embodiment of the present invention can be further improved because a spin current can be injected into the magnetic body 130 more effectively. For example, tungsten (W) has a spin diffusion length of about 5 nm, and thus the thickness of the conductor 120 is determined by taking the spin diffusion length of tungsten (W) into consideration. Accordingly, the characteristics of the device 100 for measuring a magnetic field according to an embodiment of the present invention can be improved effectively.

Next, the magnetic body 130 and the magnetic field application means 140 are described.

The magnetic body 130 has magnetic anisotropy, and a spin current formed in the conductor 130 is injected into the magnetic body 130. Furthermore, the magnetic field application means 140 applies a given second magnetic field to the magnetic body 130.

The spin current injected into the magnetic body 130 forms a spin torque, and the second magnetic field from the magnetic field application means 140 also forms a second magnetic field torque. If the sum of the spin torque and the second magnetic field torque overcomes an internal torque based on magnetic anisotropy of the magnetic body 130, the magnetization of the magnetic body 130 is reversed.

In particular, the magnetic body 130 may have vertical magnetic anisotropy. The fabrication of a magnetic body having the vertical magnetic anisotropy was disclosed in detail in another patent (Korean Patent Application Publication No. 10-2012-0091804) of the present invention. In this case, the intensity of a calculated first magnetic field may be the vertical intensity of the first magnetic field applied to the magnetic body 130. Accordingly, in an embodiment of the present invention, the vertical intensity of the first magnetic field can be calculated effectively using the magnetic body 130 having the vertical magnetic anisotropy, but the present invention is not necessarily limited thereto. The magnetic body 130 may be applied to the present invention although it has a constantly inclined angle without having vertical magnetic anisotropy. Intensity at a given angle not the vertical intensity of the first magnetic field may be calculated.

Furthermore, the conductor 120 and the magnetic body 130 form a stack structure, thus being capable of improving the characteristics of the device 100 for measuring a magnetic field according to an embodiment of the present invention, such as facilitating the injection of the spin current.

Next, the magnetic field application means 140 applies the given second magnetic field to the magnetic body 130 having magnetic anisotropy. In this case, the magnetic field application means 140 may apply a predetermined given magnetic field value to the magnetic body 130 by taking into consideration the characteristics of the magnetic body 130 and the conductor 120. In an embodiment of the present invention, since a horizontal magnetic anisotropy magnetic body is positioned on the top or bottom of the magnetic body 130, the second magnetic field may be applied to the magnetic body 130, but the present invention is not necessarily limited thereto. The characteristics of the device 100 for measuring a magnetic field according to the present invention can be further improved by adjusting a magnetic field applied by the magnetic field application means 140 depending on a magnetic field measurement condition.

Furthermore, the controller 150 calculates a shift degree of the magnetic hysteresis curve of the magnetic body 120 when a first magnetic field is applied with respect to the magnetic hysteresis curve of the magnetic body 130 in the state in which the first magnetic field has not been applied, and calculates the intensity of the first magnetic field using the calculated shift degree.

In this case, the controller 150 may calculate the magnetic hysteresis curve of the magnetic body 130 while increasing or decreasing the amount of the spin current by changing the amount of the current applied from the current application means 110 to the conductor 120, and may calculate a shift degree of the magnetic hysteresis curve of the magnetic body 130 when the first magnetic field is applied.

Furthermore, more specifically, the controller 150 may calculate the magnetic hysteresis curve of the magnetic body 130 by measuring a hall voltage in the conductor 120 or the magnetic body 130 while changing the amount of the current applied from the current application means 110 to the conductor 120, and thus may calculate a shift degree of the magnetic hysteresis curve of the magnetic body 130 when the first magnetic field is applied.

In an embodiment of the present invention, the current applied from the current application means 110 to the conductor 120 may be controlled so that it increases up to a point of time at which the magnetization of the magnetic body 130 is reversed or later and then decrease up to a point of time at which the magnetization of the magnetic body is reversed again or later or it deceases up to a point of time at which the magnetization of the magnetic body 130 is reversed or later and then increase up to a point of time at which the magnetization of the magnetic body is reversed again or later.

Furthermore, a previously stored magnetic hysteresis curve may be used or a magnetic hysteresis curve when the absolute values of a first current at the point of time at which the magnetization of the magnetic body 130 is reversed and a second current at the point of time at which the magnetization of the magnetic body 130 is reversed again in an opposite direction are identical may be used as the magnetic hysteresis curve of the magnetic body 130 when the first magnetic field is not applied.

Furthermore, the controller 150 may calculate the intensity of the first magnetic field applied to the magnetic body 130 based on the derived shift degree of the magnetic hysteresis curve of the magnetic body 130 using the shift value of the previously stored magnetic hysteresis curve according to the intensity of the first magnetic field.

Figure 2A:
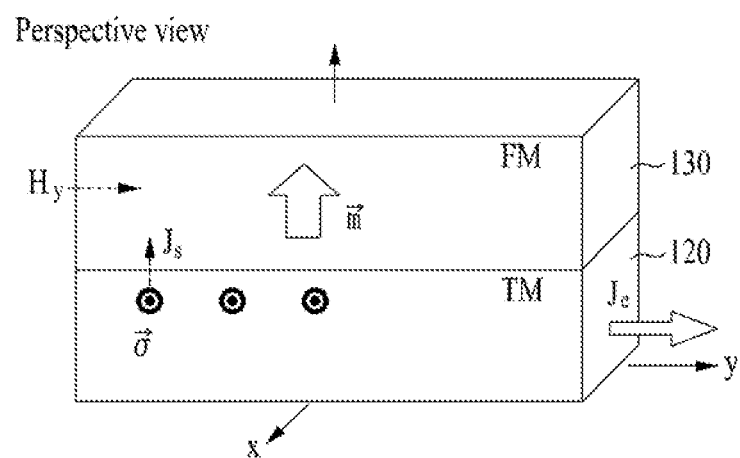
FIGS. 2A and 2B show an explanatory diagram for illustrating the formation and injection of a spin current in the device for measuring a magnetic field according to an embodiment of the present invention.
Figure 2B:
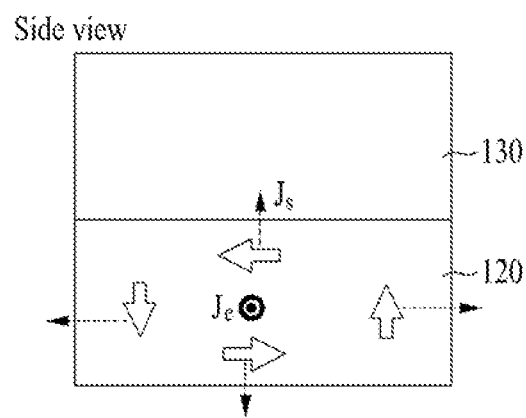
Figure 3A:
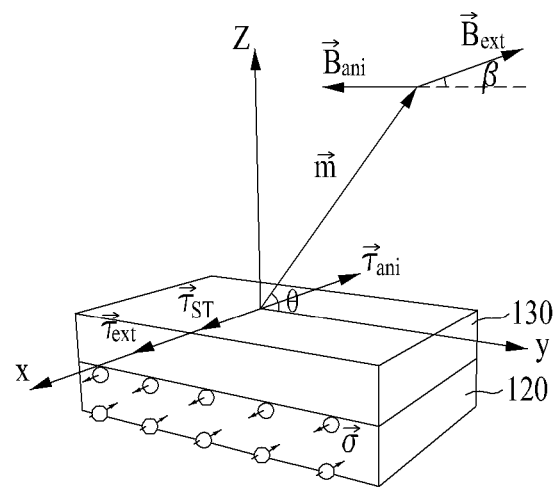
FIGS. 3A and 3B show an explanatory diagram for illustrating a torque in the device for measuring a magnetic field according to an embodiment of the present invention.
Figure 3B:
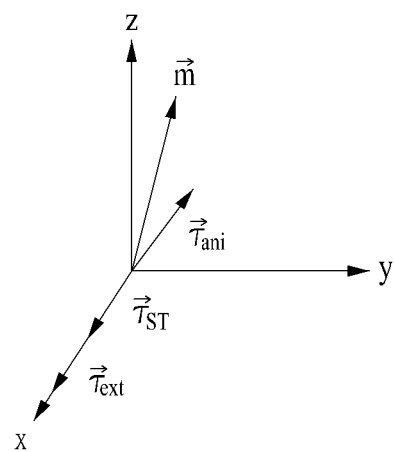

More specifically, FIGS. 2A and 2B illustrate the formation and injection of a spin current in the device 100 for measuring a magnetic field according to an embodiment of the present invention. FIGS. 3A and 3B shows a diagram for illustrating a torque in the device 100 for measuring a magnetic field according to an embodiment of the present invention.

As may be seen from FIGS. 2A and 2B, a current ($J_e$) applied from the current application means 110 forms a spin current ($J_s$) while flowing through the conductor 120. Some of the spin current ($J_s$) is injected into the magnetic body 130. In this case, as may be seen from FIG. 2A, when the current ($J_e$) applied from the current application means 110 flows in a y-axis direction, the direction of a spin moment in the spin current ($J_s$) injected into the magnetic body 130 is an x-axis direction.

Furthermore, as described above, the magnetic field application means 140 applies the second magnetic field ($H_y$) to the magnetic body 130. In this case, the second magnetic field ($H_y$) may be applied in the y-axis direction by taking into consideration the directions of the spin current ($J_e$) and spin moment according to the current ($J_e$) as may be seen from FIG. 2B, but the present invention is not necessarily limited thereto.

The conductor 120 is preferably configured using transition metal (TM) or heavy metal. Furthermore, the magnetic body 130 may be configured using a substance having magnetic anisotropy, such as ferromagnetic material (FM).

Furthermore, as may be seen from FIGS. 3A and 3B, the spin current injected into the magnetic body 130 forms a spin torque ($\tau_{ST}$). The second magnetic field from the magnetic field application means 140 forms a second magnetic field torque ($\tau_{ext}$). If the sum of the spin torque and the second magnetic field torque overcomes an internal torque ($\tau_{ani}$) according to the magnetic anisotropy of the magnetic body 130, the magnetization ($\vec{m}$) of the magnetic body 130 is reversed.

More specifically, the spin torque ($\tau_{ST}$) based on the spin current injected into the magnetic body 130, the second magnetic field torque ($\tau_{ext}$) based on the second magnetic field of the magnetic field application means 140, and the internal torque ($\tau_{ani}$) based on the magnetic anisotropy of the magnetic body 130 may be expressed as in Equation 1 to Equation 3.

$$\tau_{ST} = \frac{\hbar}{2eM_S t} J_S ((\hat{m} \times \hat{\sigma} \times \hat{m}), (\hat{\sigma} = \hat{x}) \quad \text{[Equation 1]}$$

$$\tau_{ext} = (-\hat{m} \times \vec{B}_{ext}) \quad \text{[Equation 2]}$$

$$\tau_{ani} = (-\hat{m} \times \vec{B}_{ani}) \quad \text{[Equation 3]}$$

In this case, as described above, $\vec{m}$ denotes the magnetization of the magnetic body 130, and ნ indicates a spin moment in the spin current ($J_s$) injected into the magnetic body 130. Furthermore, $\vec{B}_{ext}$ denotes magnetic flux density according to the second magnetic field, and $\vec{B}_{ani}$ denotes magnetic flux density according to the magnetic anisotropy of the magnetic body 130.

As may be seen from Equation 1 to Equation 3, the spin torque ($\tau_{ST}$) depends on the spin current ($J_s$) injected into the magnetic body 130. The second magnetic field torque ($\tau_{ext}$) depends on the second magnetic field of the magnetic field application means 140. Furthermore, the spin torque ($\tau_{ST}$) and the internal torque ($\tau_{ani}$) have opposite directions.

Figure 4A:
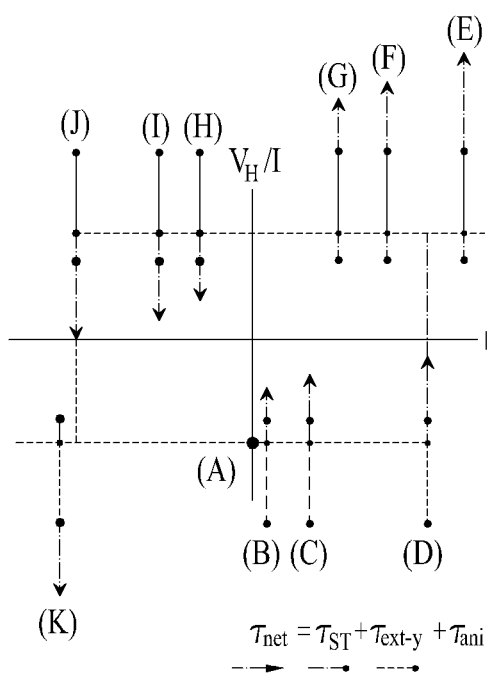
FIGS. 4A and 4B show an explanatory diagram of a shift of the magnetic hysteresis curve of the magnetic body in the device for measuring a magnetic field according to an embodiment of the present invention.
Figure 4B:
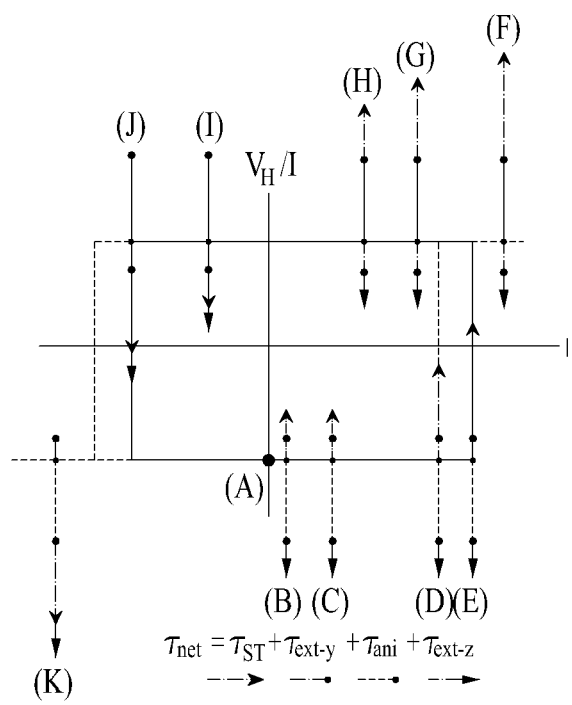

A torque in the magnetic body 130 and the corresponding magnetic hysteresis curve of the magnetic body 130 are described below by taking into consideration the above contents. FIGS. 4A and 4B illustrate a shift of a magnetic hysteresis curve according to a torque in the magnetic body 130 of the device 100 for measuring a magnetic field according to an embodiment of the present invention.

First, FIG. 4A illustrates a change in the torque according to a current applied from the current application means 110 and a corresponding magnetic hysteresis curve if an externally applied magnetic field (i.e., the first magnetic field to be measured) is not present. In this case, the second magnetic field of the magnetic field application means 140 is assumed to be applied in the y direction, and a corresponding torque is expressed as a y-direction second magnetic field torque ($\tau_{ext-y}$).

The state in which there is no current applied from the current application means 110 may be said to correspond to (A) of FIG. 4A. In this case, a spin torque ($\tau_{ST}$) according to a spin current may be said to be not present. Next, as a current applied from the current application means 110 increases, a spin torque ($\tau_{ST}$) according to a spin current increases ((B), (C) of FIG. 4A). The magnetization ($\vec{m}$) of the magnetic body 130 is reversed at the point ((D) of FIG. 4A) at which the sum of the spin torque ($\tau_{ST}$) and the y-direction second magnetic field torque ($\tau_{ext-y}$) exceeds the internal torque ($\tau_{ani}$) according to the magnetic anisotropy of the magnetic body 130. Accordingly, the directions of the internal torque ($\tau_{ani}$) according to the magnetic anisotropy of the magnetic body 130 and the y-direction second magnetic field torque ($\tau_{ext-y}$), which depend on the magnetization ($\vec{m}$) of the magnetic body 130 (refer to Equation 2 and Equation 3) are also reversed.

Furthermore, the current applied from the current application means 110 may be further increased ((E) of FIG. 4A). Although the current applied from the current application means 110 is decreased ((F) to (I) of FIG. 4A), the magnetization ($\vec{m}$) of the magnetic body 130 continues to be maintained. In this case, as the current applied from the current application means 110 continues to decrease (or increase in an opposite direction), the spin torque ($\tau_{ST}$) according to the spin current also decreases (or increases in an opposite direction) ((F) to (I) of FIG. 4A). The magnetization ($\vec{m}$) of the magnetic body 130 is reversed again at the point ((J) of FIG. 4A) at which the sum of the spin torque ($\tau_{ST}$) and the y-direction second magnetic field torque ($\tau_{ext-y}$) exceeds the internal torque ($\tau_{ani}$) according to the magnetic anisotropy of the magnetic body 130.

Accordingly, as may be seen from FIG. 4A, a magnetic hysteresis curve in the magnetic body 130 of the device 100 for measuring a magnetic field according to an embodiment of the present invention is formed.

In contrast, FIG. 4B illustrates a shift of a magnetic hysteresis curve when an externally applied magnetic field (i.e., a first magnetic field to be measured) is present in the device 100 for measuring a magnetic field according to an embodiment of the present invention. In this case, the externally applied first magnetic field is assumed to be applied in the z direction, and a corresponding torque is expressed as a z-direction first magnetic field torque ($\tau_{ext-z}$).

First, the state in which a current applied from the current application means 110 is not present (point (A) of FIG. 4B) may be said to be the state in which a spin torque ($\tau_{ST}$) according to a spin current is not present. Next, as the current applied from the current application means 110 increases, the spin torque ($\tau_{ST}$) according to the spin current increases ((B) to (D) of FIG. 4B). The magnetization ($\vec{m}$) of the magnetic body 130 is reversed at the point ((E) of FIG. 4B) at which the sum of the spin torque ($\tau_{ST}$) and a y-direction second magnetic field torque ($\tau_{ext-y}$) exceeds the sum of an internal torque ($\tau_{ani}$) according to the magnetic anisotropy of the magnetic body 130 and a z-direction first magnetic field torque ($\tau_{ext-z}$). Accordingly, the directions of the internal torque ($\tau_{ani}$) according to the magnetic anisotropy of the magnetic body 130 and the y-direction second magnetic field torque ($\tau_{ext-y}$), which depend on the magnetization ($\vec{m}$) of the magnetic body 130 (refer to Equation 2 and Equation 3), are also reversed.

Furthermore, the current applied from the current application means 110 may be further increased ((F) of FIG. 4B). Next, although the current applied from the current application means 110 decreases ((G) to (I) of FIG. 4B), the magnetization ($\vec{m}$) of the magnetic body 130 continues to be maintained. In this case, as the current applied from the current application means 110 continues to decrease (or increase in an opposite direction), the spin torque ($\tau_{ST}$) according to the spin current decreases (or increases in an opposite direction) ((G) to (I) of FIG. 4B). The magnetization ($\vec{m}$) of the magnetic body 130 is reversed again at the point ((J) of FIG. 4B) at which the spin torque ($\tau_{ST}$) and the y-direction second magnetic field torque ($\tau_{ext-y}$) exceeds the sum of the internal torque ($\tau_{ani}$) according to the magnetic anisotropy of the magnetic body 130 and the z-direction first magnetic field torque ($\tau_{ext-z}$).

Accordingly, as may be seen from FIG. 4B, if an externally applied first magnetic field is present, a magnetic hysteresis curve in the magnetic body 130 is shifted as much as the z-direction first magnetic field torque ($\tau_{ext-z}$) according to the externally applied first magnetic field. Accordingly, the externally applied first magnetic field can be calculated by calculating a shift degree of the magnetic hysteresis curve in the magnetic body 130 of the device 100 for measuring a magnetic field according to an embodiment of the present invention.

Figure 5A:
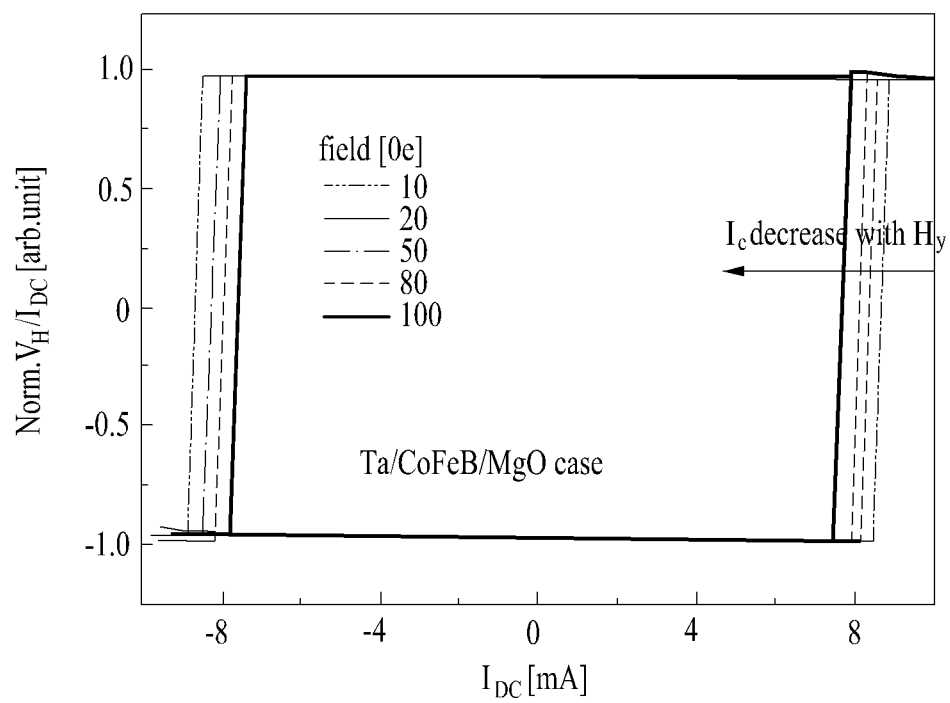
FIGS. 5A and 5B show a graph showing a change in the magnetic hysteresis curve of the magnetic body based on a change in an applied magnetic field in the device for measuring a magnetic field according to an embodiment of the present invention.
Figure 5B:
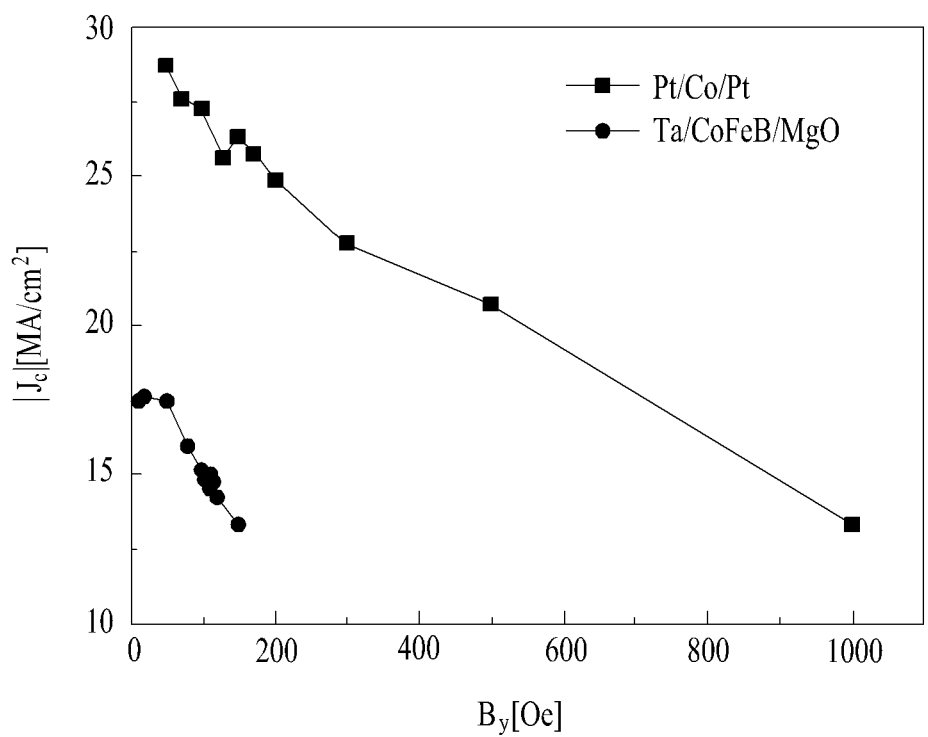

FIGS. 5A and 5B illustrate a change in the magnetic hysteresis curve of the magnetic body according to a change in the second magnetic field applied from the magnetic field application means 140 in the device 100 for measuring a magnetic field according to an embodiment of the present invention. From FIG. 5A, it may be seen that as the second magnetic field ($H_y$) applied from the magnetic field application means 140 increases, the value of a current ($I_c$) for reverting the magnetization of the magnetic body 130 increases. Furthermore, FIG. 5B is a graph showing the trend of the value of current density ($J_c$) for reverting the magnetization of the magnetic body 130 according to the second magnetic field ($H_y$) applied from the magnetic field application means 140 in the device 100 for measuring a magnetic field including a Pt/Co/Pt structure and a Ta/CoFeB/MgO structure according to an embodiment of the present invention. From FIG. 5B, it may be seen that as the second magnetic field ($H_y$) increases, the current density ($J_c$) for reverting the magnetization of the magnetic body 130 decreases.

Figure 6A:
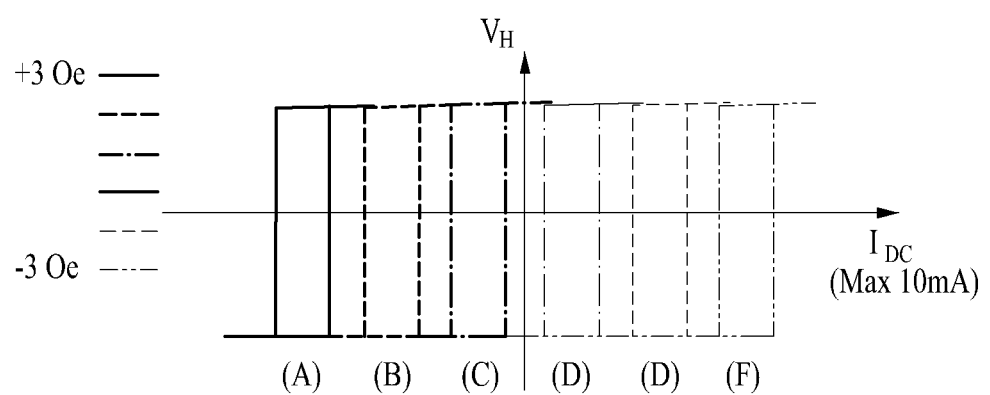
FIGS. 6A and 6B show an explanatory diagram of a method of calculating a shift of a magnetic hysteresis curve in the device for measuring a magnetic field according to an embodiment of the present invention.
Figure 6B:
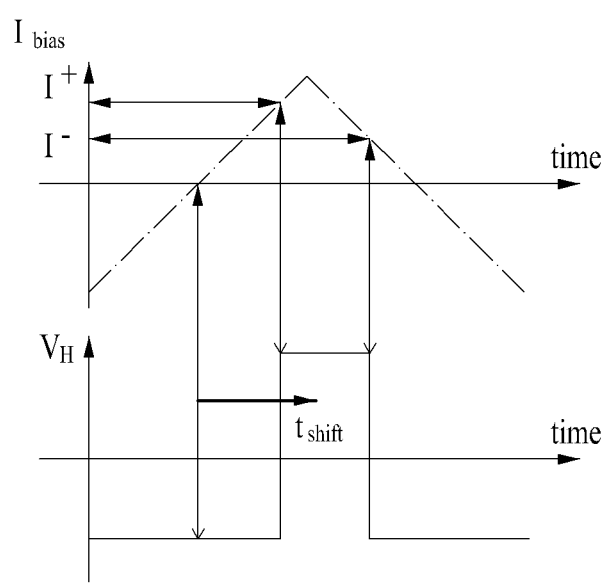

FIGS. 6A and 6B show a detailed process of calculating a shift of a magnetic hysteresis curve in the device 100 for measuring a magnetic field according to an embodiment of the present invention. As may be seen from FIG. 6A, the magnetic hysteresis curve of the magnetic body 130 is shifted left and right depending on the size of an externally applied magnetic field (i.e., the first magnetic field to be measured) ((A) to (F) of FIG. 6A). Accordingly, the device 100 for measuring a magnetic field according to an embodiment of the present invention measures the points (I$^+$ and I$^-$ in FIG. 6B) at which the magnetization of the magnetic body 130 is reversed by measuring a hall voltage ($V_H$) in the conductor 120 or the magnetic body 130 while increasing or decreasing a current applied from the current application means 110 to the conductor 120, and calculates a shift degree of a magnetic hysteresis curve based on the measured points, thus being capable of calculating the size of an externally applied first magnetic field.

Figure 7A:
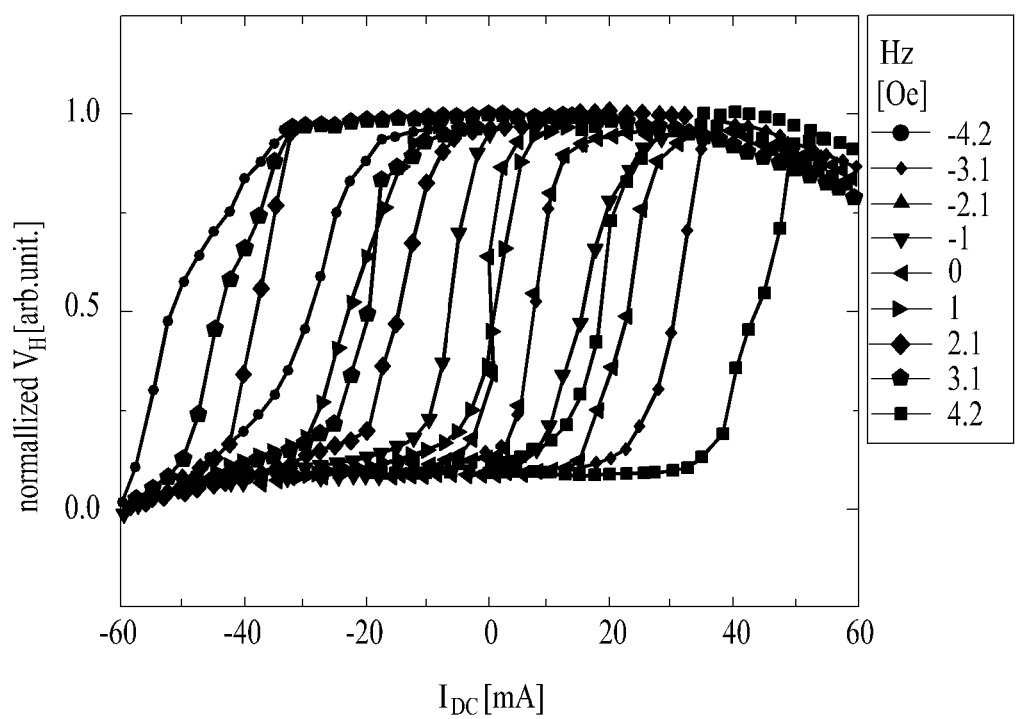
FIGS. 7A and 7B show a measurement graph of a shift of a magnetic hysteresis curve according to the intensity of an external magnetic field in the device for measuring a magnetic field according to an embodiment of the present invention.
Figure 7B:
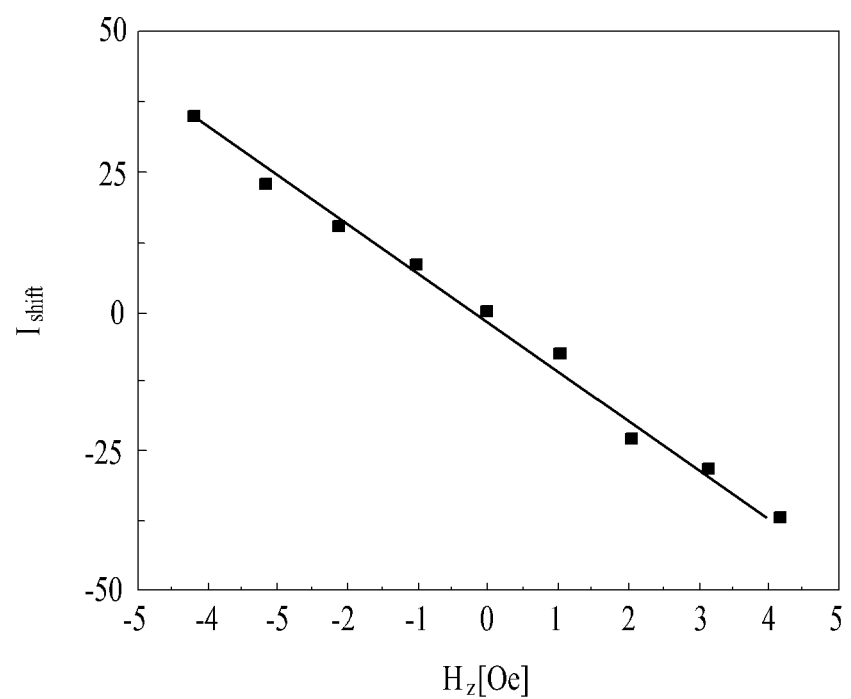

Furthermore, FIGS. 7A and 7B show graph in which a shift of a magnetic hysteresis curve according to the intensity of an external magnetic field in the device 100 for measuring a magnetic field according to an embodiment of the present invention was measured. From FIG. 7A, it may be seen that as the size of an externally applied magnetic field (i.e., the first magnetic field to be measured) increases, the magnetic hysteresis curve of the magnetic body 130 is shifted. In this case, the graph was measured in the state in which the second magnetic field of 50 Oe was applied from the magnetic field application means 140 to the magnetic body 130. From FIG. 7A, it may be seen that although the size of the applied first magnetic field is a several small Oe level, a shift of the magnetic hysteresis curve is shifted greatly (about 10 mV/Oe).

Furthermore, FIG. 7B is a graph in which a shift of a magnetic hysteresis curve according to the size of the first magnetic field applied to the magnetic body 130 was measured based on a current value. From FIG. 7B, it may be seen that a shift degree of the magnetic hysteresis curve linearly appears in response to a change in the first magnetic field. It may be seen that the size of the first magnetic field applied to the magnetic body 130 can be calculated by measuring the shift degree of the magnetic hysteresis curve using the linear shift. In particular, it may be seen that if sensitivity of the device 100 for measuring a magnetic field is calculated by converting a current value ($I_{shift}$) for the shift of the magnetic hysteresis curve based on $V_{shift}=I_{shift} \times R_{sensor}$ (~several k$\Omega$), the device has high sensitivity of about 10 mV/O.

Such results were similarly monitored in several buffer materials (FeZr/Ta, Ta/FeZr, etc.). The same aspect appeared in a single Ta or FeZr structure. Furthermore, in an embodiment of the present invention, magnetization reversion in a multi-layer structure into which FeZr has been inserted may be used.

MODE FOR INVENTION

Figure 8A:
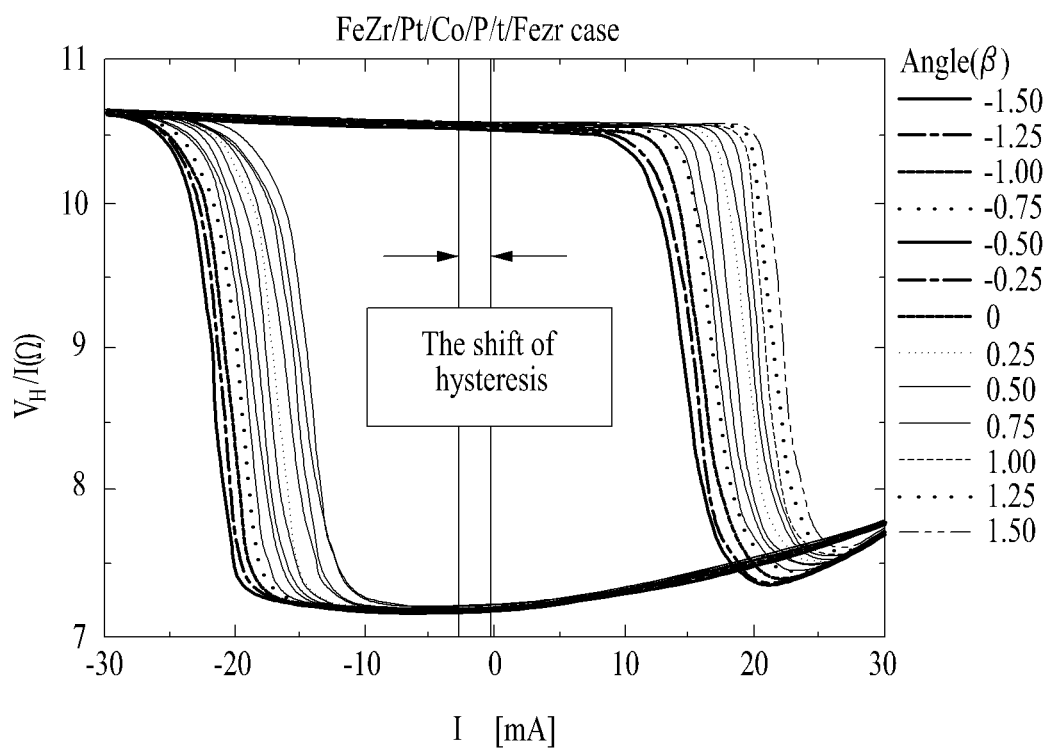
FIGS. 8A and 8B show a measurement graph of a shift of the magnetic hysteresis curve of the magnetic body when an external magnetic field is applied in the device for measuring a magnetic field according to an embodiment of the present invention.
Figure 8B:
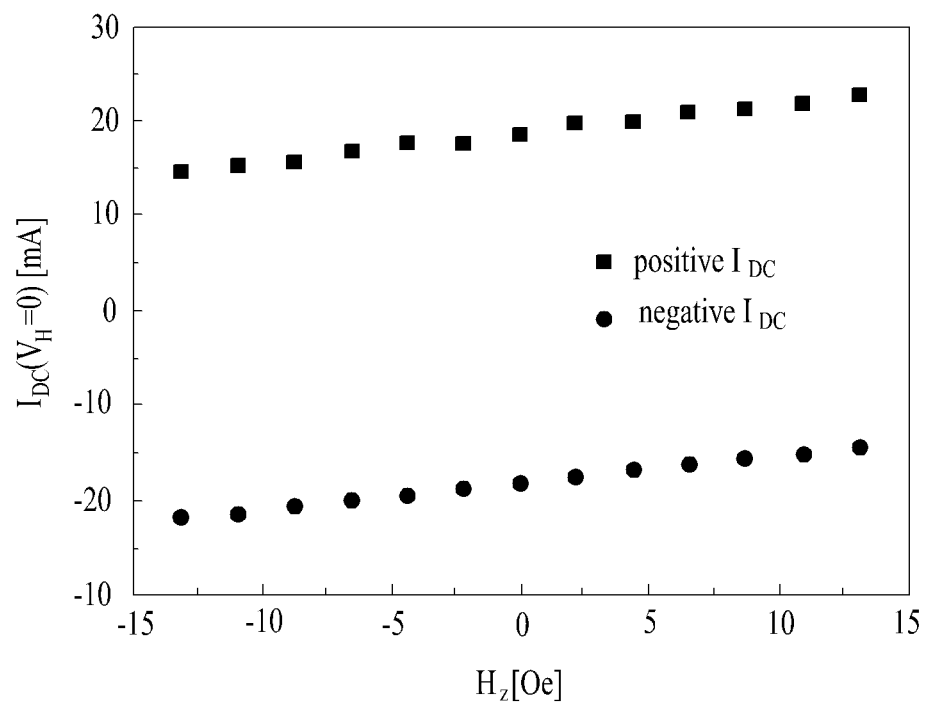

FIGS. 8A and 8B show a graph in which a shift of the magnetic hysteresis curve of the magnetic body 130 was measured when an external magnetic field (i.e., the first magnetic field to be measured) was applied in the device 100 for measuring a magnetic field, having a FeZr/Pt/Co/Pt/FeZr structure, according to an embodiment of the present invention. From FIG. 8A, it may be seen that as the size of the externally applied first magnetic field increases, the magnetic hysteresis curve of the magnetic body 130 is shift to the right. Accordingly, the size of the externally applied first magnetic field can be calculated by deriving the shift degree of the magnetic hysteresis curve.

FIG. 8B shows a graph in which a current applied from the current application means 110 to the conductor 120 was measured at the point at which the magnetization of the magnetic body 130 was reversed in the case of FIG. 8A. From FIG. 8B, it may be seen that as the size of the externally applied first magnetic field increases, a current ($I_{DC}c$) increases at the point at which a hall voltage in the conductor 120 or the magnetic body 130 becomes 0 V (i.e., the center point of a magnetic hysteresis curve).

Figure 9A:
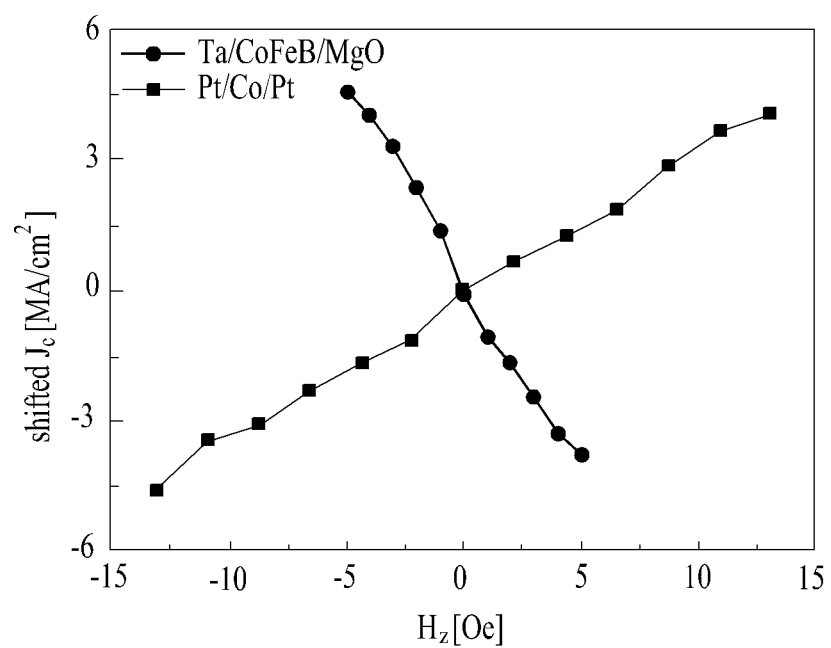
FIGS. 9A and 9B show a graph showing characteristics in the device for measuring a magnetic field according to an embodiment of the present invention.
Figure 9B:
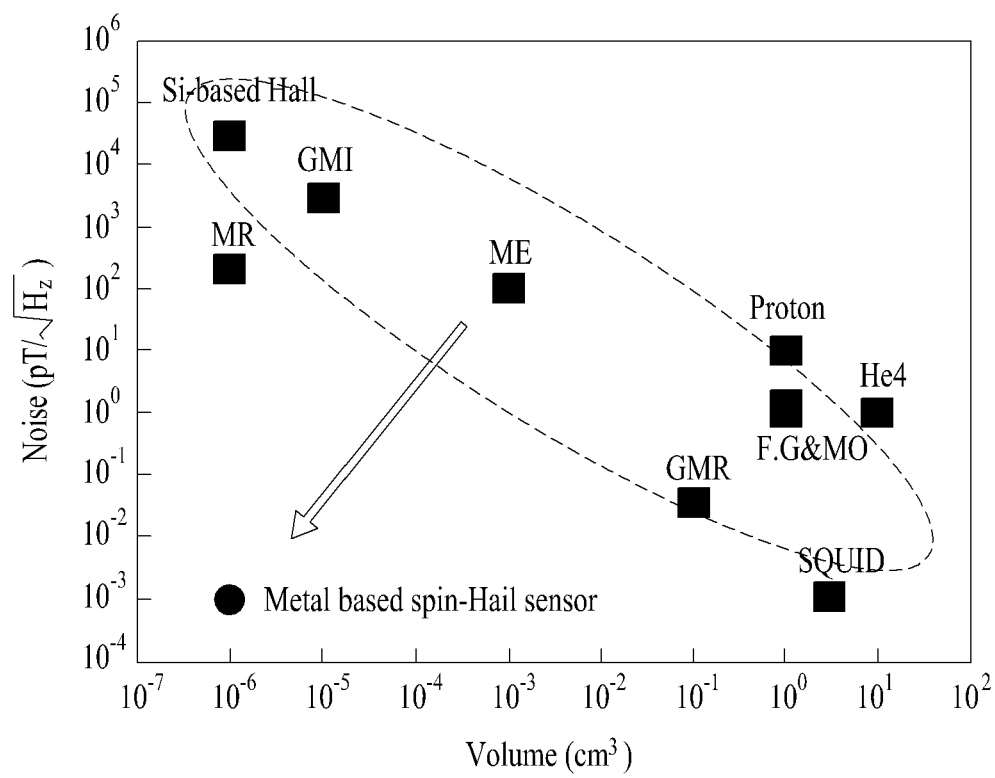

FIGS. 9A and 9B show a graph showing characteristics in the device 100 for measuring a magnetic field according to an embodiment of the present invention. First, FIG. 9A illustrates shifts of magnetic hysteresis curves according to an externally applied first magnetic field in the device 100 for measuring a magnetic field, having a Ta/CoFeB/MgO structure and a Pt/Co/Pt structure, based on current density ($J_c$). From FIG. 9A, it may be seen that in the device 100 for measuring a magnetic field having the Pt/Co/Pt structure, the shift of the magnetic hysteresis curve linearly increases as the size of the first magnetic field increases, whereas in the device 100 for measuring a magnetic field having the Ta/CoFeB/MgO structure, the shift of the magnetic hysteresis curve linearly decreases as the size of the first magnetic field increases. The reason for this is that the direction of a spin current may be different depending on the material of the conductor 120. In particular, it may be seen that in the device 100 for measuring a magnetic field having the Ta/CoFeB/MgO structure, the shift degree of the magnetic hysteresis curve is very great as the size of the first magnetic field varies. Accordingly, it may be seen that the device 100 for measuring a magnetic field having the Ta/CoFeB/MgO structure may have a higher sensitivity characteristic.

FIG. 9B shows the sizes and noise characteristics of several types of magnetic sensors through a comparison. As may be seen from FIG. 9B, the GMR sensor has a relatively better noise characteristic, but may have a great size. Furthermore, the silicon (Si)-based hall sensor can be fabricated in a small size, but may have a low noise characteristic. Furthermore, in the conventional common magnetic sensor, the size and noise characteristic tend to be traded off, as may be seen from FIG. 9B. In contrast, the device 100 for measuring a magnetic field according to an embodiment of the present invention may have advantages in that it has an excellent noise characteristic and can be fabricated in a small size, as may be seen from FIG. 9B (metal based spin-hall sensor). Furthermore, the device 100 for measuring a magnetic field according to an embodiment of the present invention can have an excellent sensitivity characteristic as described above.

Figure 10:
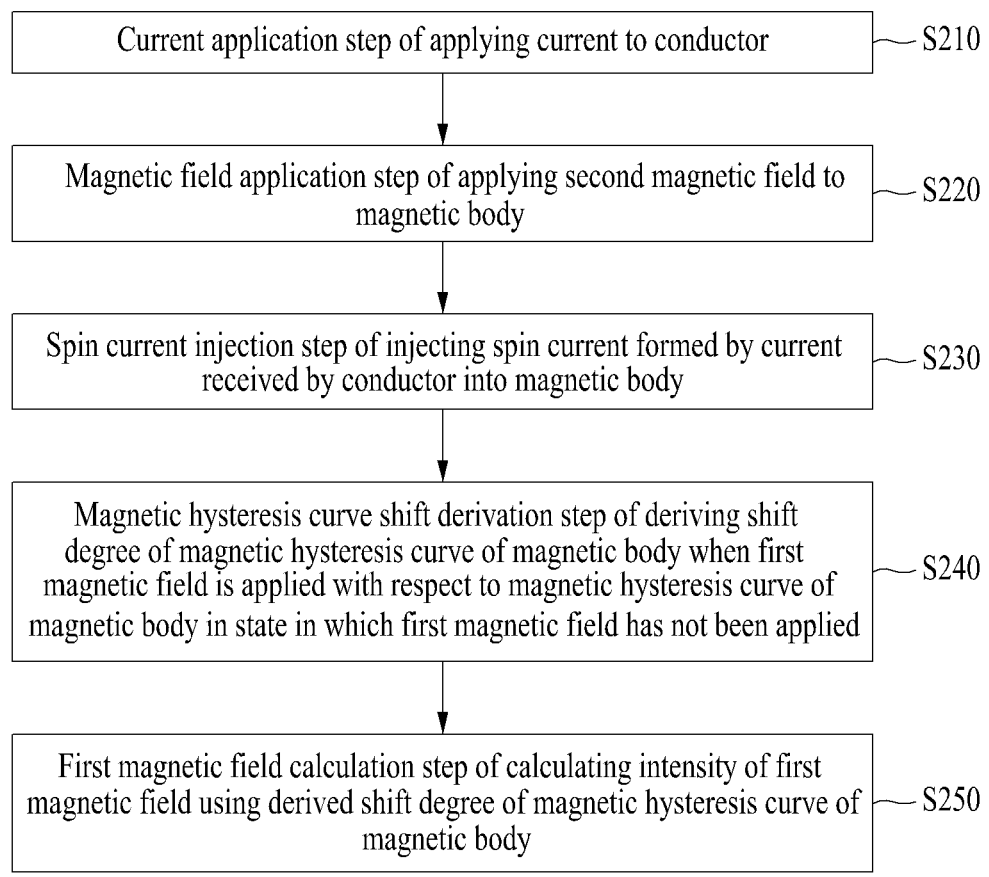
FIG. 10 is a flowchart of a method of measuring a magnetic field according to an embodiment of the present invention.

FIG. 10 is a flowchart of a method of measuring a magnetic field according to an embodiment of the present invention. As may be seen from FIG. 10, the method of measuring a magnetic field according to an embodiment of the present invention may include a current application step S210 of applying a current to the conductor 120, a magnetic field application step S220 of applying a second magnetic field to the magnetic body 130 having magnetic anisotropy, a spin current injection step S230 of injecting a spin current formed by a current received by the conductor 120 into the magnetic body 130, a magnetic hysteresis curve shift derivation step S240 of deriving a shift degree of a magnetic hysteresis curve of the magnetic body 130 when the first magnetic field is applied with respect to the magnetic hysteresis curve of the magnetic body 130 in the state in which the first magnetic field has not been applied, and a first magnetic field calculation step S250 of calculating the intensity of the first magnetic field using the derived shift degree of the magnetic hysteresis curve of the magnetic body 130.

In this case, in the current application step S210, the amount of the spin current may be increased or decreased by changing the amount of the current applied to the conductor 130. Accordingly, in the first magnetic field calculation step S250, after the magnetic hysteresis curve of the magnetic body is calculated based on the increase or decrease of the spin current, the shift degree of the magnetic hysteresis curve of the magnetic body 130 when the first magnetic field is applied may be calculated.

In this case, the first magnetic field calculation step S250 may include the step of calculating the magnetic hysteresis curve of the magnetic body 130 by measuring a hall voltage in the conductor 120 or the magnetic body 130 according to a change in the amount of the current applied to the conductor 120.

Furthermore, in the magnetic field application step S220, a given second magnetic field is applied to the magnetic body 130 having magnetic anisotropy. In an embodiment of the present invention, since a horizontal magnetic anisotropy magnetic body is positioned on the top or bottom of the magnetic body 130, the second magnetic field may be applied to the magnetic body 130.

Next, in the spin current injection step S230, the current applied to the conductor 120 may increase up to a point of time at which the magnetization of the magnetic body 130 is reversed or later and then decrease up to a point of time at which the magnetization of the magnetic body 130 is reversed again or later or may decrease up to a point of time at which the magnetization of the magnetic body 130 is reversed or later and then increase up to a point of time at which the magnetization of the magnetic body is reversed again or later.

In this case, the magnetic body 130 may have vertical magnetic anisotropy. Furthermore, the calculated intensity of the first magnetic field may be vertical intensity of the first magnetic field applied to the magnetic body 130.

Furthermore, the conductor 120 may be transition metal or heavy metal. In this case, the thickness of the conductor 120 may be determined by taking into consideration a spin diffusion length. In this case, the conductor 120 and the magnetic body 130 may form a stack structure.

Furthermore, in the magnetic hysteresis curve shift derivation step S240, in preparation for the magnetic hysteresis curve of the magnetic body 130 in the state in which the first magnetic field has not been applied, a shift degree of the magnetic hysteresis curve of the magnetic body 130 when the first magnetic field is applied is derived. In this case, a previously measured and stored magnetic hysteresis curve may be used or a magnetic hysteresis curve in the state in which the absolute values of a first current at the point of time at which the magnetization of the magnetic body 130 is reversed and a second current at the point of time at which the magnetization of the magnetic body 130 is reversed again in an opposite direction are identical may be used as the magnetic hysteresis curve of the magnetic body 130 when the first magnetic field is not applied.

Next, in the first magnetic field calculation step S250, the intensity of the first magnetic field is calculated using the derived shift degree of the magnetic hysteresis curve of the magnetic body 130. In an embodiment of the present invention, in the first magnetic field calculation step S250, the intensity of the first magnetic field may be calculated from the derived shift degree of the magnetic hysteresis curve of the magnetic body 130 using a shift value of the magnetic hysteresis curve based on the previously stored intensity of the first magnetic field.

While some exemplary embodiments of the present invention have been described with reference to the accompanying drawings, those skilled in the art may change and modify the present invention in various ways without departing from the essential characteristic of the present invention. Accordingly, the disclosed embodiments should not be construed as limiting the technological spirit of the present invention, but should be construed as illustrating the technological spirit of the present invention. The scope of the technological spirit of the present invention is not restricted by the embodiments, and the range of protection of the present invention should be interpreted based on the following appended claims. Accordingly, the present invention should be construed as covering all modifications or variations derived from the meaning and scope of the appended claims and their equivalents.

The invention claimed is:

1. A magnetic field measurement device measuring an externally applied first magnetic field, the magnetic field measurement device comprising:
   a current source configured to supply a current;
   a conductor connected to the current source and configured to form a spin current using the current supplied from the current source;
   a first magnetic body having magnetic anisotropy, connected with the conductor, and configured to receive the spin current formed in the conductor;
   a second magnetic body coupled with the first magnetic body and configured to apply a second magnetic field to the first magnetic body; and
   a controller connected to the current source and configured to
      control the supplied current of the current source,
      measure a shift degree of a magnetic hysteresis curve of the first magnetic body when the first magnetic field is applied with respect to a magnetic hysteresis curve of the magnetic body in a state in which the first magnetic field has not been applied, and
      calculate intensity of the first magnetic field using the measured shift degree.

2. The magnetic field measurement device of claim 1, wherein the controller calculates the magnetic hysteresis curve of the first magnetic body while increasing or decreasing an amount of the spin current by changing an amount of the current applied from the current source to the conductor and then calculates the shift degree of the magnetic hysteresis curve of the first magnetic body when the first magnetic field is applied.

3. The magnetic field measurement device of claim 2, wherein the controller calculates the magnetic hysteresis curve of the first magnetic body by measuring a hall voltage in the conductor or the first magnetic body while changing the amount of the current applied from the current source to the conductor.

4. The magnetic field measurement device of claim 2, wherein the current applied from the current source to the conductor increases up to a point of time at which a magnetization of the first magnetic body is reversed or later and then decreases up to a point of time at which the magnetization of the f magnetic body is reversed again or later or decreases up to a point of time at which the magnetization of the first magnetic body is reversed or later and then increases up to a point of time at which the magnetization of the first magnetic body is reversed again or later.

5. The magnetic field measurement device of claim 1, wherein:
the magnetic body has vertical magnetic anisotropy, and
the calculated intensity of the first magnetic field is vertical intensity of the first magnetic field applied to the first magnetic body.

6. The magnetic field measurement device of claim 1, wherein the conductor is transition metal or heavy metal.

7. The magnetic field measurement device of claim 1, wherein a thickness of the conductor is determined by taking into consideration a spin diffusion length.

8. The magnetic field measurement device of claim 1, wherein the conductor and the first magnetic body form a stack structure.

9. The magnetic field measurement device of claim 1, wherein the second magnetic body has horizontal magnetic anisotropy and is positioned on a top or bottom of the first magnetic body.

10. The magnetic field measurement device of claim 1, wherein the controller uses a previously measured and stored magnetic hysteresis curve or a magnetic hysteresis curve in a state in which absolute values of a first current at a point of time at which a magnetization of the first magnetic body is reversed and a second current at a point of time at which the magnetization of the first magnetic body is reversed again in an opposite direction are identical as the magnetic hysteresis curve of the first magnetic body when the first magnetic field is not applied.

11. The magnetic field measurement device of claim 1, wherein the controller calculates the intensity of the first magnetic field from the derived shift degree of the magnetic hysteresis curve of the first magnetic body using a shift value of the magnetic hysteresis curve based on previously stored intensity of the first magnetic field.

12. A magnetic field measurement method of measuring an externally applied first magnetic field, comprising:
a current application step of applying a current to a conductor;
a magnetic field application step of applying a second magnetic field to a magnetic body having magnetic anisotropy;
a spin current injection step of injecting a spin current formed by a current received by the conductor into the magnetic body;
a magnetic hysteresis curve shift derivation step of deriving a shift degree of a magnetic hysteresis curve of the magnetic body when the first magnetic field is applied with respect to a magnetic hysteresis curve of the magnetic body in a state in which the first magnetic field has not been applied; and
a first magnetic field calculation step of calculating intensity of the first magnetic field using the derived shift degree of the magnetic hysteresis curve of the magnetic body.

13. The magnetic field measurement method of claim 12, wherein:
in the current application step, an amount of the spin current is increased or decreased by changing an amount of the current applied to the conductor, and
in the first magnetic field calculation step, after the magnetic hysteresis curve of the magnetic body is calculated based on the increase or decrease of the spin current, the shift degree of the magnetic hysteresis curve of the magnetic body when the first magnetic field is applied is calculated.

14. The magnetic field measurement method of claim 13, wherein the first magnetic field calculation step comprises a step of calculating the magnetic hysteresis curve of the magnetic body by measuring a hall voltage in the conductor or the magnetic body according to a change in the amount of the current applied to the conductor.

15. The magnetic field measurement method of claim 13, wherein in the spin current injection step, the current applied to the conductor increases up to a point of time at which a magnetization of the magnetic body is reversed or later and then decreases up to a point of time at which the magnetization of the magnetic body is reversed again or later or decreases up to a point of time at which the magnetization of the magnetic body is reversed or later and then increases up to a point of time at which the magnetization of the magnetic body is reversed again or later.

16. The magnetic field measurement method of claim 12, wherein: the magnetic body has vertical magnetic anisotropy, and the calculated intensity of the first magnetic field is vertical intensity of the first magnetic field applied to the magnetic body.

17. The magnetic field measurement method of claim 12, wherein the conductor is transition metal or heavy metal.

18. The magnetic field measurement method of claim 12, wherein a thickness of the conductor is determined by taking into consideration a spin diffusion length.

19. The magnetic field measurement method of claim 12, wherein the conductor and the magnetic body form a stack structure.

20. The magnetic field measurement method of claim 12, wherein in the magnetic field application step, a second magnetic field is applied to the magnetic body using a horizontal magnetic anisotropy magnetic body positioned on a top or bottom of the magnetic body.

* * * * *